United States Patent
Kermalli et al.

(10) Patent No.: US 9,543,911 B2
(45) Date of Patent: Jan. 10, 2017

(54) PHASE-MODULATED LOAD APPARATUS AND METHOD

(71) Applicant: Futurewei Technologies, Inc., Plano, TX (US)

(72) Inventors: Munawar Kermalli, Morris Plains, NJ (US); Zhengxiang Ma, Summit, NJ (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 83 days.

(21) Appl. No.: 14/281,522

(22) Filed: May 19, 2014

(65) Prior Publication Data

US 2015/0333701 A1    Nov. 19, 2015

(51) Int. Cl.
| | |
|---|---|
| H03F 3/68 | (2006.01) |
| H03F 3/24 | (2006.01) |
| H03F 1/02 | (2006.01) |
| H03G 1/00 | (2006.01) |
| H01P 1/397 | (2006.01) |
| H03H 7/19 | (2006.01) |

(Continued)

(52) U.S. Cl.
CPC ............ *H03F 3/245* (2013.01); *H01P 1/397* (2013.01); *H03F 1/02* (2013.01); *H03F 1/0294* (2013.01); *H03F 3/68* (2013.01); *H03G 1/0005* (2013.01); *H03H 7/19* (2013.01); *H03H 7/21* (2013.01); *H03F 2200/451* (2013.01); *H03F 2201/3212* (2013.01); *H03H 7/40* (2013.01)

(58) Field of Classification Search
CPC ............ H03F 1/07; H03F 1/0288; H03F 3/68; H03F 1/3252; H03F 1/0294; H03F 3/211; H03F 1/32; H03F 3/24; H03F 2200/336; H03F 1/0261; H03F 1/0211; H04B 1/0483

USPC    330/84, 86, 124 R, 126, 130, 295; 333/117, 122, 124, 248; 379/338, 443; 455/127.1, 143, 108, 110

See application file for complete search history.

(56) References Cited

U.S. PATENT DOCUMENTS

| | | | | |
|---|---|---|---|---|
| 5,264,807 A | * | 11/1993 | Okubo | ............. H03F 1/02 330/124 R |
| 7,071,776 B2 | * | 7/2006 | Forrester | ............. H03G 3/001 330/129 |

(Continued)

FOREIGN PATENT DOCUMENTS

| | | |
|---|---|---|
| WO | 0191282 A2 | 11/2001 |
| WO | 2007084033 A1 | 7/2007 |

OTHER PUBLICATIONS

Erker et al., "Monolithic Ka-Band Phase Shifter Using Voltage Tunable BaSrTiO3 Parallel Plate Capacitors", IEEE Microwave and Guided Wave Letters, vol. 10, No. 1, Jan. 2000, pp. 10-12.*

(Continued)

*Primary Examiner* — Steven J Mottola
*Assistant Examiner* — Hafizur Rahman
(74) *Attorney, Agent, or Firm* — Slater Matsil, LLP (57) ABSTRACT

Methods and apparatus are provided to improve the efficiency of an outphasing amplifier through modulating the phase angle of a reflected signal in the outphasing amplifier. An outphasing amplifier includes a first amplifier and a second amplifier. A circulator is provided having a first port coupled to an output of the outphasing amplifier, a second port coupled to a load and a third port coupled to a phase shifter. The phase shifter is configured to provide a different phase angle of a reflected signal from the phase shifter to the outphasing amplifier through the circulator.

20 Claims, 4 Drawing Sheets

(51) Int. Cl.
 *H03H 7/21* (2006.01)
 *H03H 7/40* (2006.01)

(56) References Cited

U.S. PATENT DOCUMENTS

| | | | |
|---|---|---|---|
| 8,384,475 B2* | 2/2013 | Gustavsson | H03F 1/0288 330/124 R |
| 8,593,219 B1* | 11/2013 | Root | H03F 1/0288 330/124 R |
| 2010/0074367 A1* | 3/2010 | Kim | H03F 1/0294 375/296 |
| 2013/0229227 A1 | 9/2013 | Maniwa | |

OTHER PUBLICATIONS

Tsai-Pi Hung, "High Efficiency Switching Mode Amplifiers for Wireless Communications Systems", Ph. D. Dessertation to University of California, Sandiego, pp. 75-78.*

* cited by examiner

PHASE-MODULATED LOAD APPARATUS AND METHOD

TECHNICAL FIELD

The present invention relates to an outphasing amplifier apparatus, and more particularly, to methods and apparatus to improve the efficiency of an outphasing amplifier through modulating the phase angle of a reflected signal in the outphasing amplifier.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of standards such as the $2^{nd}$-Generation (2G) technology such as Global System for Mobile Communications (GSM) and/or the like, the $3^{rd}$-Generation (3G) technology such as Universal Mobile Telecommunications System (UMTS) and/or the like, and the $4^{th}$-Generation (4G) technology such as Long Term Evolution (LTE) and/or the like.

A wireless network may include a plurality of wireless devices and a plurality of base stations. The wireless devices may be notebook computers, mobile phones or Personal Digital Assistant (PDA) devices, media players, tablet computers, large format mobile phones, digital readers, gaming devices, and various combinations thereof and/or the like.

The base stations communicate with the wireless devices over a plurality of wireless channels coupled between the wireless device and the base stations (e.g., a downlink channel from a base station to a wireless device). The wireless device may send back information, including channel information, to the base stations over a plurality of feedback channels (e.g., an uplink channel from the wireless device to the base station) in a manner that provides service to a desired coverage area, without contributing undue interference.

Power amplifiers are important components in the base stations of a wireless network. High efficiency and high linearity power amplifiers are desirable in order to improve the performance of a wireless communication system.

As wireless techniques further advance, outphasing amplifiers have been employed to improve efficiency and linearity of an amplitude-modulated radio frequency system. In a wireless system having outphasing amplifiers, an amplitude-modulated signal is decomposed into two phase-modulated signals by a signal component separator. These two phase-modulated signals are of the same envelope while having opposite phase variations. Such two constant-envelope signals are amplified by two separate amplifiers to produce two amplified signals, which are sent to a power combiner and are combined at the output of the outphasing amplifier to form an amplified replica of the original amplitude-modulated signal.

SUMMARY OF THE INVENTION

These and other problems are generally solved or circumvented, and technical advantages are generally achieved, by preferred embodiments of the present invention which provide a system, apparatus and method for improving the efficiency of an outphasing amplifier through modulating the phase of a reflected signal in the outphasing amplifier. An advantage of a preferred embodiment of the present invention is improving the efficiency of an outphasing amplifier through dynamically adjusting the phase angle of a reflected signal in the outphasing amplifier.

In accordance with an embodiment, an outphasing amplifier is provided having a first amplifier and a second amplifier. A circulator is provided having a first port coupled to an output of the outphasing amplifier. A second port is coupled to a load, and a third port is coupled to a phase shifter. In response to a control signal, the phase shifter is configured to provide a different phase angle of a reflected signal from the phase shifter to the outphasing amplifier through the circulator.

In accordance with another embodiment, a processor is configured to generate a first constant-envelope signal and a second constant-envelope signal from an amplitude-modulated signal. An outphasing amplifier comprising a first amplifier and a second amplifier is provided, wherein the first amplifier and the second amplifier receive the first constant-envelope signal and the second constant-envelope signal respectively. A circulator includes a first port coupled to an output of the outphasing amplifier, a second port coupled to a load and a third port coupled to a phase shifter.

The system further comprises the phase shifter configured to provide a different phase angle of a reflected signal from the phase shifter to the outphasing amplifier through the circulator in response to a control signal.

In accordance with yet another embodiment, a method comprises decomposing an amplitude-modulated signal into a first phase-modulated signal and a second phase-modulated signal, amplifying the first phase-modulated signal and the second phase-modulated signal to produce a first amplified signal and a second amplified signal through a first amplifier and a second amplifier respectively, combining the first amplified signal and the second amplified signal at an output of an outphasing amplifier, wherein the outphasing amplifier comprises the first amplifier and the second amplifier and in response to a load variation, adjusting a phase angle of a reflected signal from a phase shifter to the outphasing amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Disclosed embodiments provide many applicable inventive concepts that can be embodied in a wide variety of specific contexts. The specific embodiments discussed are merely illustrative of specific ways by which the invention can be configured, and do not limit the scope of the invention.

The present invention will be described with respect to preferred embodiments in a specific context, namely improving the efficiency of an outphasing amplifier through adjusting the phase angle of a reflected signal from a phase shifter to the outphasing amplifier. The invention may also be applied, to efficiency enhancements to a variety of telecommunication products such as wireless base stations and/or the like. Hereinafter, various embodiments will be explained in detail with reference to the accompanying drawings.

Figure 1:
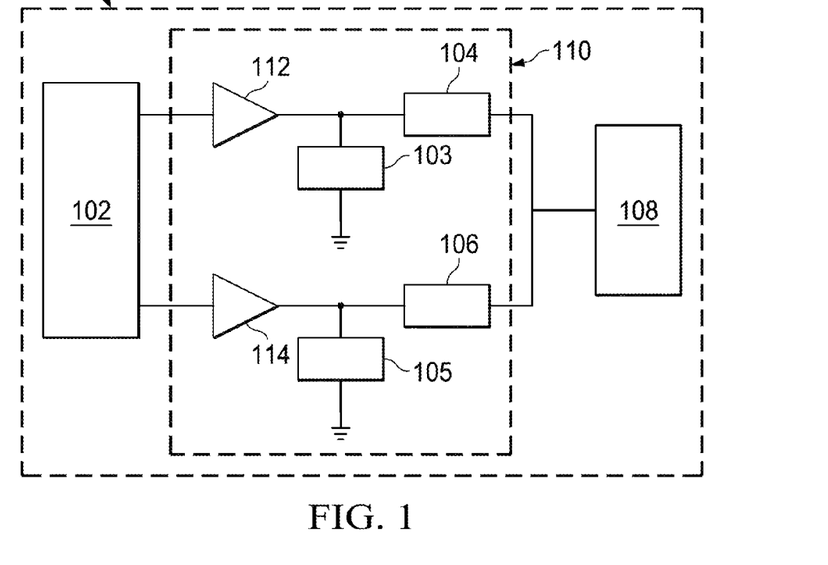
FIG. 1 illustrates a block diagram of an amplifier system in accordance with various embodiments of the present disclosure.

FIG. 1 illustrates a block diagram of an amplifier system in accordance with various embodiments of the present disclosure. The amplifier system 100 includes a processor 102, an outphasing amplifier 110 and a load 108. As shown in FIG. 1, two constant-envelope signals are generated by the processor 102 and may be fed into the outphasing amplifier 110. The constant-envelope signals are amplified in the outphasing amplifier 110 and combined into a single signal, which is fed into the load 108.

The processor 102 may be any suitable baseband processors such as a digital signal processor (DSP) chip and/or the like. The processor 102 is employed to manage radio frequency functions such as decomposing a transmitted signal into two constant amplitude signals, and provide control software for radio communication. The processor 102 may be further coupled to other mobile device function units such as an application processor and/or the like.

The outphasing amplifier 110 is coupled between the processor 102 and the load 108. In particular, the outphasing amplifier 110 may include a first amplifier 112 and a second amplifier 114. As shown in FIG. 1, there may be a power combiner coupled between the outputs of the amplifiers (e.g., amplifiers 112 and 114) and the load 108. In some embodiments, the power combiner may be a transmission line impedance transformer.

In alternative embodiments as shown in FIG. 1, the power combiner may include a first quarter-wavelength transmission line 104 and a second quarter-wavelength transmission line 106. As shown in FIG. 1, the first quarter-wavelength transmission line 104 is coupled between the output of the first amplifier 112 and the input of the load 108. Likewise, the second quarter-wavelength transmission line 106 is coupled between the output of the second amplifier 114 and the input of the load 108.

The power combiner may further include two reactive components. As shown in FIG. 1, the first reactive component 103 is coupled between the output of the first amplifier 112 and ground. Likewise, the second reactive component 105 is coupled between the output of the second amplifier 114 and ground.

In accordance with some embodiments, both the first reactive component 103 and the second reactive component 105 may function as shunt impedances. The outputs of the amplifiers 112 and 114 may comprise a real power component and a reactive power component. The reactive power component may cause an efficiency drop as known in the art. In order to minimize the impact from the reactive power component, the first reactive component 103 and the second reactive component 105 are employed to make the output impedance seen by the amplifiers behave as a resistive impedance. Employing reactive components (e.g., the first reactive component 103 and the second reactive component 105) for reactive power compensation is well known, and hence is not discussed in further detail herein. One advantageous feature of having the reactive components is that a resistive impedance arising from employing reactive components 103 and 105 helps to reduce the reactive power processed by the outphasing amplifier 110. As a result, the efficiency of the outphasing amplifier 110 may be improved.

The first amplifier 112 has an input receiving a first signal from the processor 102. Likewise, the second amplifier 114 has an input receiving a second signal from the processor 102. Both the first signal and the second signal are constant-envelope signals derived from an amplitude-modulated signal. In some embodiments, both the first signal and the second signal are of the same amplitude and opposite modulated phase variations. In accordance with alternative embodiments, the amplitude of the first signal is substantially the same as the amplitude of the second signal.

As shown in FIG. 1, both the first signal and the second signal are separately amplified by the first amplifier 112 and the second amplifier 114 respectively. The amplified signals generated by the first amplifier 112 and the second amplifier 114 are combined together at the power combiner to form an amplified replica of the amplitude-modulated signal at the input of the load 108.

The load 108 may be in the form of an antenna operable to receive and transmit radio frequency signals. While FIG. 1 shows an antenna 108 coupled to the outphasing amplifier 110 directly, there may be a plurality of other radio frequency apparatuses such as filters coupled between the outphasing amplifier 110 and the load 108.

In addition, the antenna may include multiple antenna arrays such as two separate antennas arranged as a primary antenna and a secondary antenna. The primary antenna is configured to transmit outbound wireless signals from the mobile device to a base station or receive inbound wireless signals from the base station. The secondary antenna, as an auxiliary antenna, may not be able to transmit high performance outbound signals from the mobile device to the base station. The main function of the secondary antenna is receiving diversity wireless signals.

It should be noted while two antennas are described above, a greater or lesser number of antenna arrays can be provided. Moreover, the antenna arrays need not be configured as "primary" and "secondary", or otherwise configured to have separate operation.

In some embodiments, the amplifier system 100 may transmit wireless signals modulated based upon various standards such as such as the $2^{nd}$-Generation (2G) technology such as Global System for Mobile Communications (GSM) and/or the like, the $3^{rd}$-Generation (3G) technology such as Universal Mobile Telecommunications System (UMTS) and/or the like, and the $4^{th}$-Generation (4G) technology such as Long Term Evolution (LTE) and/or the like. In addition, the wireless signals may be modulated based upon other standards such as Worldwide Interoperability for Microwave Access (WiMAX), Wireless Local Area Network (WLAN), Ultra Wideband (UWB) and/or the like.

Figure 2A:
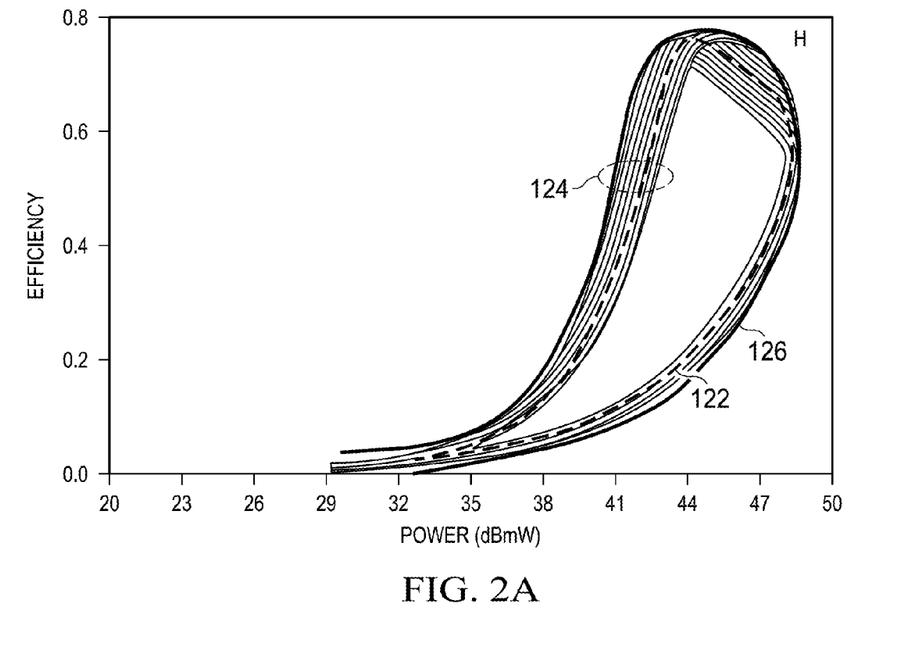
FIG. 2A shows a variety of curves illustrating the efficiency versus power characteristics of the amplifier system shown in FIG. 1 in accordance with various embodiments of the present disclosure.

FIG. 2A shows a variety of curves illustrating the efficiency versus power characteristics of the amplifier system shown in FIG. 1 in accordance with various embodiments of the present disclosure. The horizontal axis of FIG. 2A represents the power processed by the amplifier system 100. The unit of the horizontal axis is dBmW, which is an abbreviation for the power ratio in decibels of the measured power reference to one milliwatt. The vertical axis of FIG. 2A represents the efficiency of the amplifier system 100.

FIG. 2A includes a first curve 122, a family of curves 124 and an envelope curve 126. The first curve 122 is a curve of efficiency versus power when the amplifier system 100 is connected to a matching network such as a load impedance approximately equal to 50 ohm. In other words, there may be no reflection from the load to the outphasing amplifier 110.

The curves 124 represent the efficiency performance when the amplifier system 100 is connected to a non-ideal load and a phase shifter. As shown in FIG. 2A, there may be a plurality of curves 124. Each curve 124 is a curve of efficiency versus power at a particular phase angle provided by the phase shifter (not shown but illustrated in FIG. 3).

The envelope curve 126 is generated based upon the first curve 122 and the curves 124. As shown in FIG. 2A, the envelope curve 126 is a maximum value envelope curve, which connects the maximum efficiency values of the first curve 122 and the curves 124. Because the vertical axis of FIG. 2A represents the efficiency of the amplifier system 100, the envelope curve 126 represents achievable efficiency performance of the amplifier system 100 by employing different phase shifts at different power levels. Thus, in response to a power level variation, a new phase angle may be dynamically selected in accordance with the envelope curve 126. As a result, the efficiency of the amplifier system 100 is following the envelope curve 126. Such a dynamically selected phase angle may help the amplifier system 100 achieve the highest efficiency at a corresponding power level. An example of a system having two phase modulation points will be described below with respect to FIG. 2B.

Figure 2B:
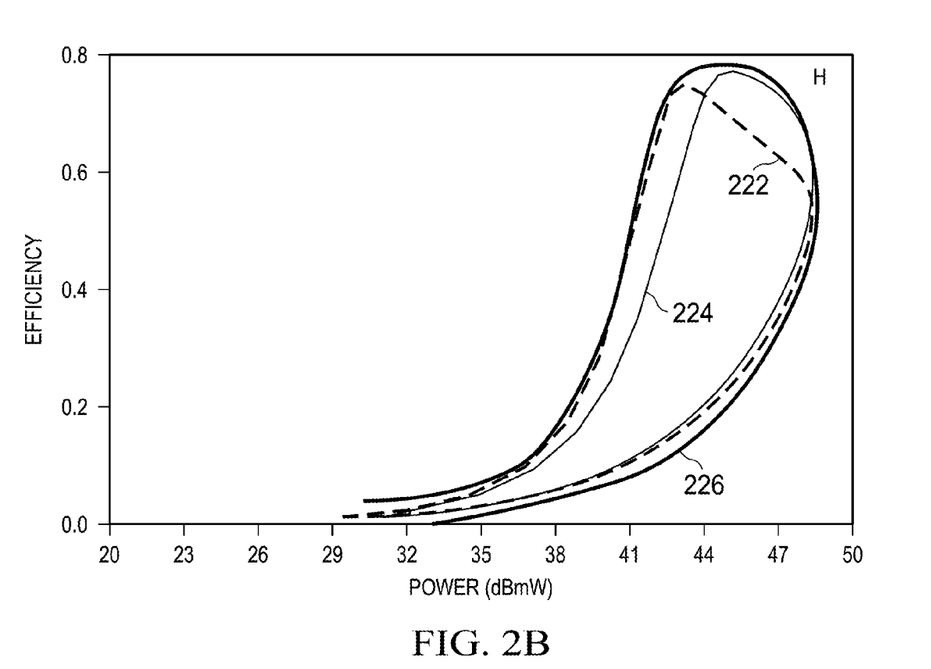
FIG. 2B shows three curves illustrating the efficiency versus power characteristics of the amplifier system shown in FIG. 1 in accordance with various embodiments of the present disclosure.

FIG. 2B shows three curves illustrating the efficiency versus power characteristics of the amplifier system shown in FIG. 1 in accordance with various embodiments of the present disclosure. The horizontal axis of FIG. 2B represents the power processed by the amplifier system 100. The unit of the horizontal axis is dBmW. The vertical axis of FIG. 2B represents the efficiency of the amplifier system 100.

FIG. 2B includes a first curve 222, a second curve 224 and a third curve 226. In some embodiments, the curves 222, 224 and 226 are measured based upon a reflected signal having power of 18 dBmW.

The first curve 222 is a curve of efficiency versus power when the outphasing amplifier 110 operates at a first phase shift. The second curve 224 is a curve of efficiency versus power when the outphasing amplifier 110 operates at a second phase shift. In some embodiments, both the first phase shift and the second phase shift are provided by a phase shifter coupled to the outphasing amplifier 110. The detailed operation principle of the phase shifter will be described below with respect to FIGS. 3-6.

The phase shifts represent by the first curve 222 and the second curve 224 may result in varying performance. As shown in FIG. 2B, the reflected signal including the second phase shift may help to improve the efficiency of the outphasing amplifier 110 at a particular power range. For example, as shown in FIG. 2B, when the power processed by the outphasing amplifier 110 is in a range from about 44 dBmW to about 48 dBmW, the efficiency of the outphasing amplifier 110 may be improved by selecting the second phase shift rather than the first phase shift. On the other hand, when the power processed by the outphasing amplifier 110 is less than 44 dBmW, the efficiency of the outphasing amplifier 110 may be improved by selecting the first phase shift rather than the second phase shift.

In short, as shown in FIG. 2B, further improved efficiency may be achieved by operating the outphasing amplifier 110 under the first curve 222 when the power processed by the outphasing amplifier 110 is less than 44 dBmW Likewise, the efficiency can be improved by operating the outphasing amplifier 110 under the second curve 224 when the power is in a range from 44 dBmW to 48 dBmW.

In sum, through controlling the phase angle of a reflected signal, the outphasing amplifier 110 may achieve better performance such as improved efficiency over a wide dynamic range even if the outphasing amplifier is connected to a non-ideal load.

It should be noted that the curves (e.g., second curve 124) may represent a reflected signal with a particular phase angle. By varying the phase angle of the reflected signal, there may be a group of curves (not shown) having efficiency better than an ideal system with no reflection from the load to the outphasing amplifier 110. As such, in order to improve the efficiency of the outphasing amplifier 110, a reflected signal may be injected into the outphasing amplifier 110. In particular, a further improvement may be achieved by employing a different phase angle at a different power level.

It should further be noted that the curves shown in FIG. 2B are merely an example, which should not unduly limit the scope of the claims. One of ordinary skill in the art would recognize many variations, alternatives, and modifications. For example, instead of having a reflected signal with an 18 dBmW power level, the reflected signal may be of other power levels such as 20 dBmW, 22 dBmW, 24 dBmW, 28 dBmW and/or the like.

In sum, an advantageous feature shown by the curves in FIG. 2B is, at different power levels, the efficiency of the outphasing amplifier 110 may be further improved by selecting different phase angles.

Figure 3:
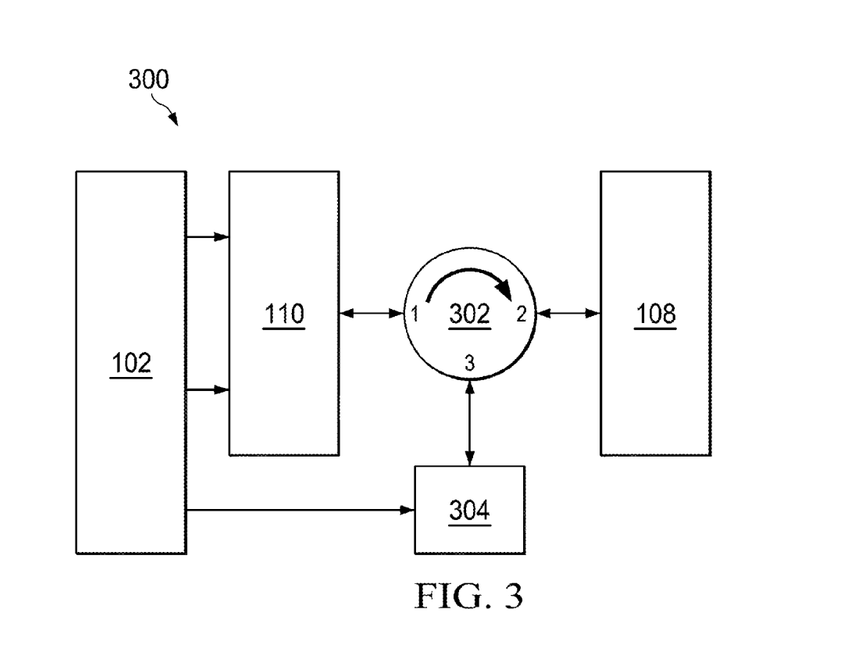
FIG. 3 illustrates a block diagram of a phase-modulated amplifier system in accordance with various embodiments of the present disclosure.

FIG. 3 illustrates a block diagram of a phase-modulated amplifier system in accordance with various embodiments of the present disclosure. The phase-modulated amplifier system 300 includes a processor 102, an outphasing amplifier 110, a circulator 302, a phase shifter 304 and a load 108. The processor 102, the outphasing amplifier 110 and the load 108 may be of the same structures as those shown in FIG. 1, and hence are not discussed in further detail herein.

The circulator 302 has three ports, namely port 1, port 2 and port 3 as shown in FIG. 3. Port 1 is coupled to the output of the outphasing amplifier 110. Port 2 is coupled to the load 108. Port 3 is coupled to the phase shifter 304.

In some embodiments, the circulator 302 is a three-port device. In particular, a signal applied to a first port of the circulator 302 is transmitted to a second port of the circulator 302. Likewise, a signal applied to the second port of the circulator 302 is transmitted to a third port of the circulator 302 and a signal applied to the third port of the circulator 302 is transmitted to the first port of the circulator 302. In sum, a signal entering one port (e.g., port 1 shown in FIG. 3) of the circulator 302 will come out of the next port (e.g., port 2 shown in FIG. 3) of the circulator 302 in rotation.

One advantageous feature of having the circulator 302 coupled between the outphasing amplifier 110 and the load 108 is that the circulator 302 may function as a decoupling device to separate the signal transmitted to the load 108 and the reflected signal sent from the phase shifter 304.

The phase shifter 304 receives a control signal from the processor 102. The control signal is used to dynamically adjust the phase angle of a reflected signal from the phase shifter 304 to the outphasing amplifier 110. In particular, the phase angle may be dynamically adjusted as a function of the envelope of the radio frequency signal processed by the outphasing amplifier 110.

In some embodiments, after detecting a magnitude change of the input signal to the outphasing amplifier 110, the processor 102 may find a corresponding phase angle value based upon the magnitude change. Such a phase angle value is included in the control signal, which is sent to the phase shifter 304. The phase shifter 304 adjusts the phase angle of the reflected signal based upon the control signal.

In some embodiments, the control signal may be generated based upon a lookup table. Alternatively, the control signal may be calculated in real time based upon the power flowing through the outphasing amplifier 110. Furthermore, the control signal may be generated based upon an optimization algorithm. For example, through a trial and error method, a better phase angle is selected so that the outphasing amplifier 110 may achieve better efficiency. The implementation of the phase shifter 304 will be described in detail below with respect to FIGS. 4-6.

Figure 4:
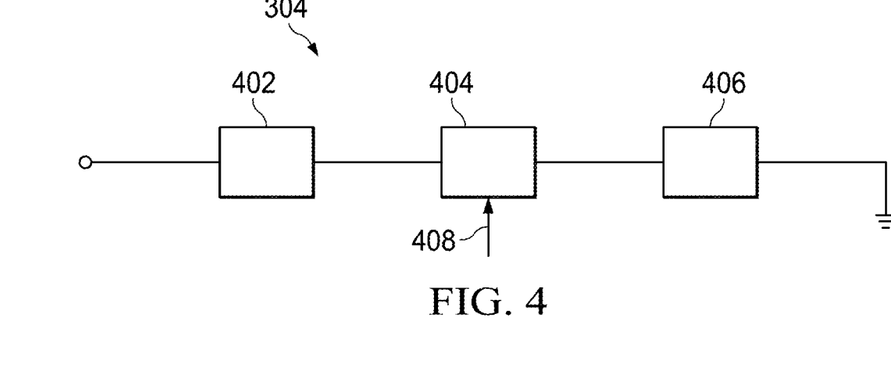
FIG. 4 illustrates a block diagram of the phase shifter shown in FIG. 3 in accordance with various embodiments of the present disclosure.

FIG. 4 illustrates a block diagram of the phase shifter shown in FIG. 3 in accordance with various embodiments of the present disclosure. The phase shifter 304 includes a first fixed impedance network 402, an adjustable impedance network 404 and a second fixed impedance network 406. The fixed impedance networks and the adjustable impedance network are connected in series between a port of the circulator (shown in FIG. 3) and ground. In other words, the first fixed impedance network 402, the adjustable impedance network 404 and the second fixed impedance network 406 are connected in cascade. A first terminal of the phase shifter 304 is coupled to the circulator and a second terminal of the phase shifter 304 is coupled to ground. The adjustable impedance network 404 receives a control signal 408, which may be generated by the processor 102 (shown in FIG. 3).

In response to different control signals, the impedance, in particular the phase angle of the reflected signal from the phase shifter 304 to the outphasing amplifier 110 may vary accordingly. The variation of the phase angle of the reflected signal helps to improve the efficiency of the outphasing amplifier 110 operating in a particular power range.

It should be noted that the phase shifter 304 may employ multiple fixed impedance networks connected in series or parallel with a number of adjustable impedance networks. One adjustable impedance network and two fixed impedance networks are shown in FIG. 4 for simplicity.

It should further be noted that the block diagram shown in FIG. 4 is merely an example, which should not unduly limit the scope of the claims. One of ordinary skill in the art would recognize many variations, alternatives, and modifications. For example, instead of connecting a terminal of the fixed impedance network 406 to ground, the terminal of the fixed impedance network 406 may be floating.

Figure 5:
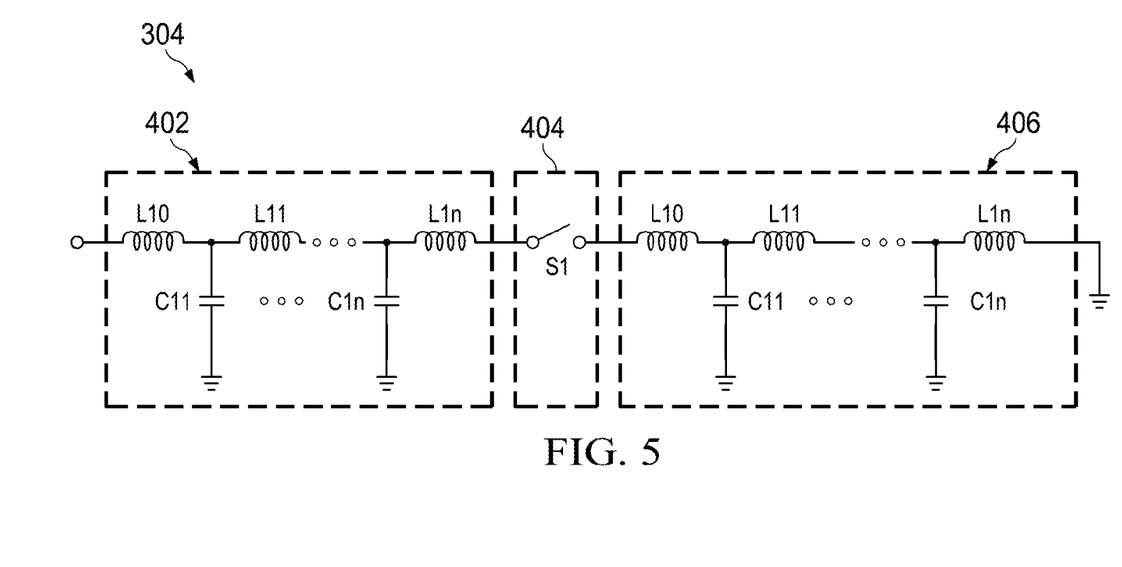
FIG. 5 illustrates a schematic diagram of the phase shifter shown in FIG. 4 in accordance with various embodiments of the present disclosure.

FIG. 5 illustrates a schematic diagram of the phase shifter shown in FIG. 4 in accordance with various embodiments of the present disclosure. The first fixed impedance network 402 may be implemented as a first transmission line. The first transmission line may be represented by a lumped-element model, which includes a plurality of series inductors (e.g., inductors L10, L11 and L1$n$) and a plurality of shunt capacitors (e.g., capacitors C11 and C1$n$). The method of calculating the transmission line parameters such as the inductance and capacitance are well known, and hence is not discussed in further detail.

The second fixed impedance network 406 may be implemented as a second transmission line as shown in FIG. 5. The lumped-element model of the second transmission line may be similar to that of the first transmission line, and hence is not discussed again herein to avoid repetition.

In some embodiments, the variation of the impedance of the phase shifter 304 as well as the phase angle of a reflected signal from the phase shifter 304 to the outphasing amplifier 110 may be achieved through a switch coupled between the first fixed impedance network 402 and the second fixed impedance network 406.

According to some embodiments, when the switch S1 is turned on, the phase shifter 304 is of a first impedance. A signal enters the phase shifter 304 and gets reflected back to the circulator 302 with a first phase angle. On the other hand, when the switch S1 is turned off and only the first fixed impedance network 402 is connected to the circulator 302, the phase shifter 304 is of a second impedance. A signal enters the phase shifter 304 and gets reflected back to the circulator 302 with a second phase angle. As such, by turning on or off the switch S1, the phase shifter 304 may provide at least two different phase angles for the reflected signal from the phase shifter 304 to the outphasing amplifier 110 (shown in FIG. 3).

Figure 6:
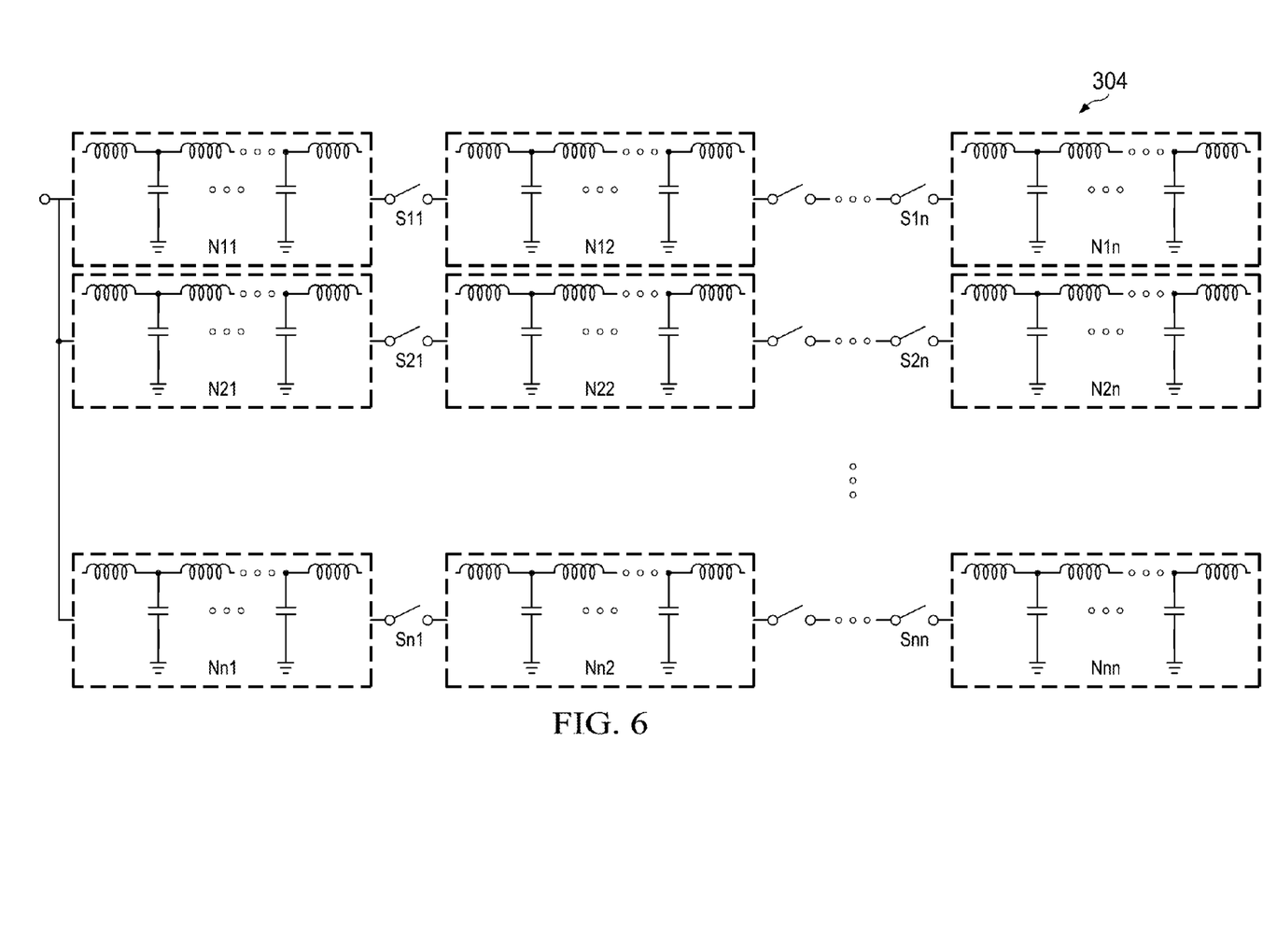
FIG. 6 illustrates another schematic diagram of the phase shifter shown in FIG. 4 in accordance with various embodiments of the present disclosure.

FIG. 6 illustrates another schematic diagram of the phase shifter shown in FIG. 4 in accordance with various embodiments of the present disclosure. The phase shifter 304 comprises a plurality of adjustable transmission lines connected in parallel as shown in FIG. 6. Each adjustable transmission line may comprise a plurality of fixed impedance networks such as N11, N12 and N1$n$. A plurality of switches such as S11 and S1$n$ are connected in series with the plurality of fixed impedance networks. More particularly, a switch such as S11 is coupled between two adjacent fixed impedance networks (e.g., networks N11 and N12). By controlling the on/off state of these switches, a variety of phase angles can be obtained.

In sum, the phase shifter 304 can be implemented as a discrete set of finite phase shifts as shown in FIG. 5. On the other hand, the phase shifter 304 may be generalized to have multiple states as shown in FIG. 6. The diagrams shown in FIG. 5 and FIG. 6 are merely examples. A person skilled in the art will recognize there may be many alternatives, modifications and variations.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
an outphasing amplifier comprising a first amplifier and a second amplifier; and
a circulator having a first port coupled to an output of the outphasing amplifier, a second port coupled to a load and a third port coupled to a phase shifter, wherein the phase shifter is configured, responsive to a control signal, to provide a different phase angle of a reflected signal from the phase shifter to the outphasing amplifier through the circulator, wherein the different phase angle is generated based upon a maximum efficiency envelope curve, wherein the maximum efficiency curve is formed by connecting maximum efficiency values of a group of curves, and wherein the group of curves include a first curve and second curve, and wherein the first curve is a curve of efficiency versus power when the load is a resistor and the second curve is a curve of efficiency versus power at a particular phase angle provided by the phase shifter.

2. The apparatus of claim 1, wherein:
the phase shifter comprises:
 a first fixed impedance network;
 an adjustable impedance network; and
 a second fixed impedance network.

3. The apparatus of claim 2, wherein:
the first fixed impedance network, the adjustable impedance network and the second fixed impedance network are connected in cascade.

4. The apparatus of claim 2, wherein:
the first fixed impedance network comprises a first transmission line;
the adjustable impedance network comprises a switch; and
the second fixed impedance network comprises a second transmission line.

5. The apparatus of claim 1, wherein:
a first terminal of the phase shifter is coupled to the circulator; and
a second terminal of the phase shifter is connected to ground.

6. The apparatus of claim 1, wherein:
a first terminal of the phase shifter is coupled to the circulator; and
a second terminal of the phase shifter is floating.

7. The apparatus of claim 1, wherein:
the phase shifter is configured to receive the control signal from a processor, and wherein the processor is coupled to the outphasing amplifier.

8. A system comprising:
a processor configured to generate a first constant-envelope signal and a second constant-envelope signal from an amplitude-modulated signal;
an outphasing amplifier comprising a first amplifier and a second amplifier, wherein the first amplifier and the second amplifier receive the first constant-envelope signal and the second constant-envelope signal respectively;
a circulator comprising:
 a first port coupled to an output of the outphasing amplifier;
 a second port coupled to a load; and
 a third port coupled to a phase shifter; and
the phase shifter configured to provide a different phase angle of a reflected signal from the phase shifter to the outphasing amplifier through the circulator in response to a control signal, wherein the different phase angle is generated based upon a maximum efficiency curve, wherein the maximum efficiency curve is formed by connecting maximum efficiency values of a group of curves, and wherein at least one maximum efficiency value is not from a curve of efficiency versus power when the load is a resistor.

9. The system of claim 8, wherein:
the control signal is generated by the processor.

10. The system of claim 8, further comprising:
a combiner coupled to the first amplifier and the second amplifier, wherein the combiner includes:
 a first transmission line coupled to an output of the first amplifier;
 a second transmission line coupled to an output of the second amplifier;
 a first reactive component coupled to a joint node between the first transmission line and the output of the first amplifier; and
 a second reactive component coupled to a joint node between the second transmission line and the output of the second amplifier.

11. The system of claim 8, wherein:
the load is an antenna.

12. The system of claim 8, further comprising:
a plurality of filters coupled between the load and the circulator.

13. The system of claim 8, wherein:
the phase shifter comprises a plurality of transmission lines and switches connected in cascade, and wherein each switch is coupled between two adjacent transmission lines.

14. A method comprising:
decomposing an amplitude-modulated signal into a first phase-modulated signal and a second phase-modulated signal;
amplifying the first phase-modulated signal and the second phase-modulated signal to produce a first amplified signal and a second amplified signal through a first amplifier and a second amplifier respectively;

combining the first amplified signal and the second amplified signal at an output of an outphasing amplifier, wherein the outphasing amplifier comprises the first amplifier and the second amplifier; and in response to a load variation, adjusting a phase angle of a reflected signal from a phase shifter to the outphasing amplifier, wherein the phase angle is generated based upon a maximum efficiency envelope curve, and wherein the method further comprises obtaining a phase angel value based upon the load variation and generating a control signal based upon the phase angle value, wherein the control signal is used to adjust the phase angle of the reflected signal from the phase shifter to the outphasing amplifier.

15. The method of claim 14, further comprising:

decomposing the amplitude-modulated signal into the first phase-modulated signal and the second phase-modulated signal, wherein the first phase-modulated signal and the second phase-modulated signal have substantially equal constant envelopes.

16. The method of claim 14, further comprising:

decomposing the amplitude-modulated signal into the first phase-modulated signal and the second phase-modulated signal, wherein the first phase-modulated signal and the second phase-modulated signal have substantially opposite phase variations.

17. The method of claim 14, further comprising:

during the step of adjusting the phase angle of the reflected signal from the phase shifter to the outphasing amplifier, activating a switch coupled between a first fixed impedance network and a second fixed impedance network.

18. The method of claim 14, further comprising:

during the step of adjusting the phase angle of the reflected signal from the phase shifter to the outphasing amplifier, deactivating a switch coupled between a first fixed impedance network and a second fixed impedance network.

19. The method of claim 14, further comprising:

detecting the load variation;

finding the phase angle value from a lookup table based upon the load variation; and generating the control signal based upon the phase angle value, wherein the control signal is used to adjust the phase angle of the reflected signal from the phase shifter to the outphasing amplifier.

20. The method of claim 14, further comprising:

detecting the load variation;

calculating the phase angle value in real time based upon the load variation; and generating the control signal based upon the phase angle value, wherein the control signal is used to adjust the phase angle of the reflected signal from the phase shifter to the outphasing amplifier.

* * * * *

UNITED STATES PATENT AND TRADEMARK OFFICE
CERTIFICATE OF CORRECTION

PATENT NO. : 9,543,911 B2
APPLICATION NO. : 14/281522
DATED : January 10, 2017
INVENTOR(S) : Munawar Kermalli et al.

It is certified that error appears in the above-identified patent and that said Letters Patent is hereby corrected as shown below:

In the Claims

In Column 11, Line 10, Claim 14, delete "angel" and insert --angle--.

Signed and Sealed this
Ninth Day of May, 2017

Michelle K. Lee
*Director of the United States Patent and Trademark Office*